US012672483B2

(12) United States Patent
Wudil et al.

(10) Patent No.: US 12,672,483 B2
(45) Date of Patent: Jun. 30, 2026

(54) METHOD OF MAKING THERMOELECTRIC MATERIALS

(71) Applicant: KING FAHD UNIVERSITY OF PETROLEUM AND MINERALS, Dhahran (SA)

(72) Inventors: Yakubu Sani Wudil, Dhahran (SA); Mohammed A. Gondal, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 915 days.

(21) Appl. No.: 17/865,610

(22) Filed: Jul. 15, 2022

(65) Prior Publication Data

US 2024/0023440 A1    Jan. 18, 2024

(51) Int. Cl.
H10N 10/01 (2023.01)
C01G 19/00 (2006.01)
H10N 10/857 (2023.01)

(52) U.S. Cl.
CPC ........... H10N 10/01 (2023.02); C01G 19/006 (2013.01); H10N 10/857 (2023.02);
(Continued)

(58) Field of Classification Search
CPC .... H10N 10/01; H10N 10/857; C01G 19/006; C01P 2002/34; C01P 2002/76; C01P 2002/77; C01P 2006/32; C01P 2006/40
See application file for complete search history.

(56) References Cited

U.S. PATENT DOCUMENTS

| | | | |
|---|---|---|---|
| 2017/0217785 A1 | 8/2017 | Yang et al. | |
| 2020/0083393 A1 | 3/2020 | Thon et al. | |
| 2021/0242389 A1 | 8/2021 | Boukai et al. | |

FOREIGN PATENT DOCUMENTS

| | | |
|---|---|---|
| CN | 109904304 A | 6/2019 |
| CN | 110484963 B | 6/2021 |
| WO | WO 2020/246590 A1 | 12/2020 |

OTHER PUBLICATIONS

G. P. Moss, p. A. S. Smith, and D. Tavernier. "Glossary of Class Names of Organic Compounds and Reactive Intermediates Based On Structure." Pure & Appl. Chem., vol. 67, Nos. 8/9, pp. 1307-1375, 1995. (Year: 1995 ).*

(Continued)

*Primary Examiner* — Paul A Wartalowicz
*Assistant Examiner* — Nicholas A. Piro
(74) *Attorney, Agent, or Firm* — Oblon, McClelland, Maier & Neustadt, L.L.P.

(57) ABSTRACT

A method of making a $CsSnI_3$ perovskite thermoelectric (TE) material including mixing a fatty acid, a fatty amine, a $C_8$-$C_{30}$ hydrocarbon, and $Cs_2CO_3$ in a vessel to form a cesium mixture; heating the cesium mixture to a temperature of 400-450 K to form a heated mixture; dissolving $SnI_2$ in an organophosphine to form a tin solution; mixing the tin solution and the heated mixture to form a reaction mixture; cooling the reaction mixture to form a precipitate comprising a $CsSnI_3$ perovskite; enclosing the $CsSnI_3$ perovskite in a chamber; pressurizing the chamber to a hydrostatic pressure of at least 0.1 GPa; and heating the chamber to a temperature of 300-1,000 K to form the $CsSnI_3$ perovskite TE material having a ZT that is at least 0.1.

10 Claims, 10 Drawing Sheets

(52) U.S. Cl.
    CPC ...... *C01P 2002/34* (2013.01); *C01P 2002/76*
        (2013.01); *C01P 2002/77* (2013.01); *C01P*
        *2006/32* (2013.01); *C01P 2006/40* (2013.01)

(56) References Cited

OTHER PUBLICATIONS

L.J-Chen, et al. "Synthesis and Optical Properties of Lead-Free Cesium Tin Halide Perovskite Quantum Rods with High-Performance Solar Cell Application." J. Phys. Chem. Lett. 2016, 7, 5028-5035. DOI: 10.1021/acs.jpclett.6b02344 (Year: 2016).*

A. B. Wong, et al. Strongly Quantum Confined Colloidal Cesium Tin Iodide Perovskite Nanoplates: Lessons for Reducing Defect Density and Improving Stability. Nano Lett. 2018, 18, 2060-2066. DOI: 10.1021/acs.nanolett.8b00077 (Year: 2018).*

S. Yalameha, et al. "Insight into the topological phase and elastic properties of halide perovskites CsSnX3 (X = I, Br, Cl) under hydrostatic pressures." J. Appl. Phys. 127, 085102 (2020); doi: 10.1063/1.5125920. (Year: 2020).*

U.-G. Jong et al. "High Thermoelectric Performance in the Cubic Inorganic Cesium Iodide Perovskites CsBl3 (B = Pb, Sn, and Ge) from First-Principles." J. Phys. Chem. C 2021, 125, 6013-6019. DOI: 10.1021/acs.jpcc.0c09929 (Year: 2021).*

N. V. Morozova, I. V. Korobeinikov, and S. V. Ovsyannikov. "Strategies and challenges of high-pressure methods applied to thermoelectric materials," J. Appl. Phys. 2019, 125, 220901. (Year: 2019).*

R. Y. Alyoubi, et al., "Effect of pressure on the mechanical, electronic and optical characters of $CsSnBr_3$ and $CsSnI_3$: ab-initio study", Modern Physics Letters B, vol. 35, No. 3, Nov. 2, 2020, 17 pages.

Shahram Yalameha, et al., "Insight into the topological phase and elastic properties of halide perovskites $CsSnX_3$ (X=I, Br, Cl) under hydrostatic pressures", AIP Journal of Applied Physics, vol. 127, Issue 8, 2020, 2 pages (Abstract only).

Lantao Yu, et al., "Thermoelectric Property Analysis of CsSnX3 Materials (X = I, Br, Cl)", 21st International Workshop on Thermal Investigations of ICS and Systems (Therminic), Sep./Oct. 2015, pp. 1-5.

* cited by examiner

METHOD OF MAKING THERMOELECTRIC MATERIALS

STATEMENT OF PRIOR DISCLOSURE BY THE INVENTORS

Aspects of the present disclosure are described in Y. S, Wudil, Q. Peng, A. Q. Alsayoud, M. A. Gondal. "Hydrostatic pressure-tuning of thermoelectric properties of $CsSnI_3$ perovskite by first-principles calculations", Oct. 4, 2021; Computational Materials Science 201, 110917. incorporated herein by reference in its entirety.

BACKGROUND

Technical Field

This invention relates to thermoelectric materials, and particularly relates to a method for preparing perovskite thermoelectric materials.

Description of the Related Art

Thermoelectric (TE) materials can convert heat to electricity and vice-versa directly. This helps minimize the adverse effect of industrial waste heat by converting it into useful energy, thereby complementing the global renewable energy production [F. Hrahsheh, Y. Sani Wudil, G. Wilemski, Confined phase separation of aqueous-organic nanodroplets, Phys. Chem. Chem. Phys. 19 (2017) 26839-26845; J. Mao, H. Zhu, Z. Ding, Z. Liu, G. A. Gamage, G. Chen, Z. Ren, High thermoelectric cooling performance of n-type $Mg_3Bi_2$-based materials, Science (80-.). 365 (2019) 495-498; B. Salhi, Y. S. Wudil, M. K. Hossain, A. Al-Ahmed, F. A. Al-Sulaiman, Review of recent developments and persistent challenges in the stability of perovskite solar cells, Renew. Sustain. Energy Rev. 90 (2018) 210-222].

Compared to other green power generation technologies, the TE materials commonly possess key advantages of scalability, low operation cost, and long lifetime. Potential areas of applications include automobiles for cooling car seats and powering mini-electronics, thermal sensors, Peltier coolers, especially for terrestrial applications where efficiency is critical, and small-scale electricity generation. [S. H. Heo, S. Jo, H. S. Kim, G. Choi, J. Y. Song, J.-Y. Kang, N.-J. Park, H. W. Ban, F. Kim, H. Jeong, J. Jung, J. Jang, W. B. Lee, H. Shin, J. S. Son, Composition change driven texturing and doping in solution-processed SnSe thermoelectric thin films, Nat. Commun. 10 (2019); B. o. Liu, D. Rajagopal, Life-cycle energy and climate benefits of energy recovery from wastes and biomass residues in the United States, Nat. Energy. 4 (2019) 700-708; B. Hinterleitner, I. Knapp, M. Poneder, Y. Shi, H. Müller, G. Eguchi, C. Eisenmenger-Sittner, M. St¨oger-Pollach, Y. Kakefuda, N. Kawamoto, Q. Guo, T. Baba, T. Mori, S. Ullah, X.-Q. Chen, E. Bauer, Thermoelectric performance of a metastable thin-film Heusler alloy, Nature 576 (2019) 85-90].

The best thermoelectric materials possess a high figure of merit, $ZT=S^2T/\rho(\kappa_E+\kappa_l)$, where T is the absolute temperature, p is the electrical resistivity, S is the Seebeck-coefficient, $\kappa_l$ and $\kappa_E$ is the lattice and electronic thermal conductivities, respectively [Y. S. Wudil, M. A. Gondal, S. G. Rao, S. Kunwar, A. Q. Alsayoud, Substrate temperature-dependent thermoelectric figure of merit of nanocrystalline $Bi_2Te_3$ and $Bi_2Te_2\cdot7Se0.3$ prepared using pulsed laser deposition supported by DFT study, Ceram. Int. 46 (2020) 24162-24172]. To achieve high ZT, a simultaneous increase in the thermoelectric power factor and a decline in the total thermal conductivity are required. However, this is extremely challenging due to the coupling existing between the various parameters involved [K. Yang, K. Cho, S. Yang, Y. Park, S. Kim, A laterally designed all-in-one energy device using a thermoelectric generator-coupled micro supercapacitor, Nano Energy. 60 (2019) 667-672]. There have been several attempts both experimentally and computationally, to devise techniques that can enhance the variables without necessarily deteriorating the remaining parameters. These methods include nanostructuring, defects incorporation, multi-scale architecture, pressure inducement, and band engineering, to mention a few.

For TE materials to favorably compete with other energy generation technologies, a ZT of 1 or above is desirable [Y. S. Wudil, M. A. Gondal, S. G. Rao, S. Kunwar, A. Q. Alsayoud, Improved thermoelectric performance of ternary $Cu/Ni/Bi_2Te2\cdot7Se0.3$ nanocomposite prepared by pulsed laser deposition, Mater. Chem. Phys. 253 (2020) 123321]. Among other TE materials, the cubic perovskite $CsSnI_3$ possesses remarkable thermoelectric potential due to its relatively low bandgap. Although its overall ZT is still relatively low, the possibility of point defect incorporation and lattice manipulations via different routes makes it a potential candidate for thermoelectric applications [W. Lu, S. Li, R. Xu, J. Zhang, D. i. Li, Z. Feng, Y. Zhang, G. Tang, Boosting thermoelectric performance of SnSe via tailoring band structure, suppressing bipolar thermal conductivity, and introducing large mass fluctuation, ACS Appl. Mater. Interfaces. 11 (2019) 45133-45141]. FIGS. 1A and 1B depict the typical unit cell of the $CsSnI_3$ compound and the corresponding high symmetry directions within the first Brillion zone.

Pressure engineering modifies a material's electronic structure, density, forces, interatomic bond distance, and intrinsic features. It can induce topological and electronic changes to anisotropic crystalline materials with strong spin-orbit coupling (SOC). Previous studies have confirmed that pressure engineering can influence materials' thermoelectric performance and electronic properties. Most contemporary TE materials have bandgaps in the range of 6-10 kBT, implying that their performance would be influenced by this quantity, particularly the power factor. Since hydrostatic pressure impacts the bandgap, the method of pressure engineering could play a role in TE materials design. High-pressure materials synthesis provides great promise in yielding an excellent figure of merit (low k and high σ). For example, $Bi_2Te_3$ and $BiSbTe_3$ fabricated at 2.5 GPa exhibited incredible ZT values compared to the samples grown at lower pressures [N. M. Alsaleh, E. Shoko, M. Arsalan, U. Schwingenschl¨ogl, Thermoelectric materials under pressure, Phys. Status Solidi—Rapid Res. Lett. 12 (2018) 1800083]. Moreover, it was reported that SnSe exhibited a high ZT value when grown at 100 Mpa. [A. Ghosh, M. S. Gusmao, P. Chaudhuri, S. Michielon de Souza, C. Mota, D. M. Triches, H. O. Frota, Electrical properties of SnSe under high-pressure, Comput. Condens. Matter. 9 (2016) 77-81].

Accordingly, one object of the present disclosure is to provide a method to make a $CsSnI_3$ perovskite under applied hydrostatic pressure with a high ZT value.

SUMMARY

In an exemplary embodiment, a method of making a $CsSnI_3$ perovskite thermoelectric material having a figure of merit (ZT) that is at least 0.1 is described. The method includes mixing a fatty acid, a fatty amine, a $C_8$-$C_{30}$ hydrocarbon, and $Cs_2CO_3$ in a vessel to form a cesium mixture and heating the cesium mixture to a temperature of 400-450 (Kelvin) K to form a heated mixture. The method further includes dissolving $SnI_2$ in an organophosphine to form a tin solution. The method further includes mixing the tin solution and the heated mixture to form a reaction mixture in an enclosed chamber, pressurizing the chamber to a hydrostatic pressure of at least 0.1 Gigapascals (GPa), and heating the chamber to a temperature of 300-1,000 K. The method further includes cooling the reaction mixture to form a precipitate including the $CsSnI_3$ perovskite thermoelectric material having a ZT that is at least 0.1.

In some embodiments, the $CsSnI_3$ perovskite has a cubic, tetragonal, or orthorhombic phase.

In some embodiments, the $CsSnI_3$ perovskite has a cubic phase.

In some embodiments, the chamber has a hydrostatic pressure of 0.1-8 GPa.

In some embodiments, the chamber has a temperature of 300-600 K.

In some embodiments, the chamber has a hydrostatic pressure of 0.1-2 GPa and a temperature of 500-600 K.

In some embodiments, the $CsSnI_3$ perovskite thermoelectric material has a ZT of 1-1.5.

In some embodiments, the chamber has a hydrostatic pressure of 0.1-2 GPa and a temperature of 300-400 K.

In some embodiments, the $CsSnI_3$ perovskite thermoelectric material has a ZT of 0.1-0.9.

In some embodiments, the chamber has a hydrostatic pressure of 2.1-8 GPa and a temperature of 300-600 K.

In some embodiments, the $CsSnI_3$ perovskite thermoelectric material has a ZT of 0.1-1.

In some embodiments, the chamber has a hydrostatic pressure of 1.7 GPa.

In some embodiments, the bandgap of the $CsSnI_3$ perovskite thermoelectric material is 0 electron volts (eV).

In some embodiments, the bandgap of the $CsSnI_3$ perovskite thermoelectric material is inverted at a pressure of 1.7 GPa.

In some embodiments, the electrical conductivity of the $CsSnI_3$ perovskite thermoelectric material increases as the hydrostatic pressure of the chamber increases.

In some embodiments, a Seebeck coefficient of the $CsSnI_3$ perovskite thermoelectric material decreases as the hydrostatic pressure of the chamber increases.

In some embodiments, a thermoelectric generator including the $CsSnI_3$ perovskite thermoelectric material, prepared by the method of the present disclosure, is described.

In some embodiments, a thermoelectric-integrated electronic chip including the $CsSnI_3$ perovskite thermoelectric material, prepared by the method of the present disclosure, is described.

In some embodiments, a module cooler including the $CsSnI_3$ perovskite thermoelectric material, prepared by the method of the present disclosure, is described.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1B:
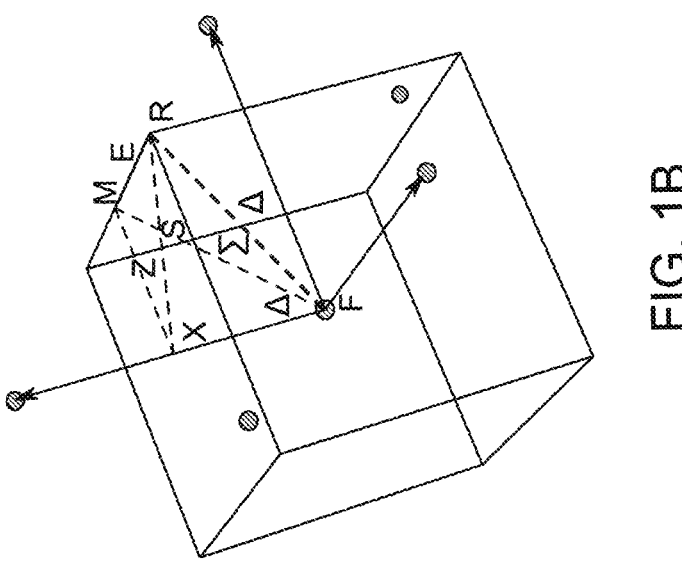
FIG. 1B shows high symmetry directions in the crystal structure of $CsSnI_3$ within a first Brillion zone, according to certain embodiments.
Figure 1A:
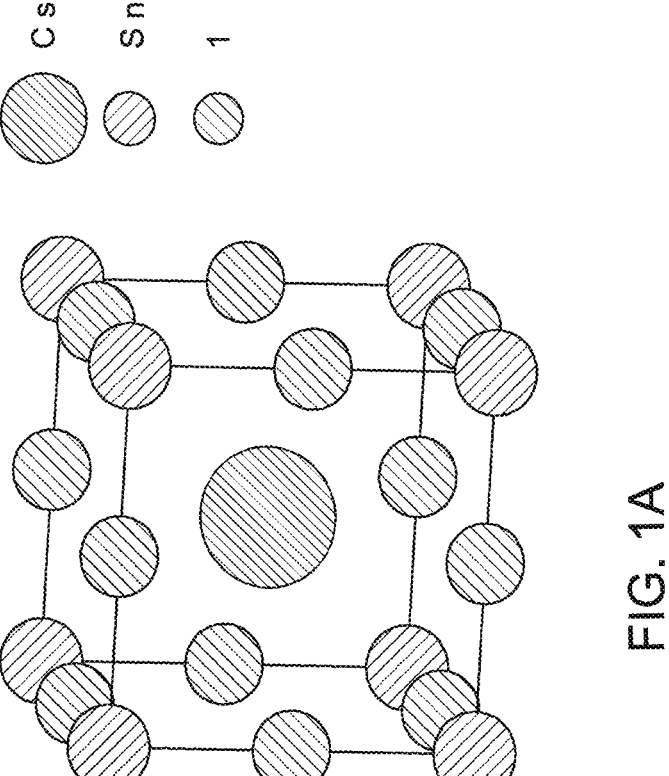
FIG. 1A depicts a unit cell crystal structure of $CsSnI_3$, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

As used herein, the term "perovskite" generally refers to a material with a crystal structure following the formula $ABX_3$, where A and B are two ions and X is an ion that bonds to both ions. A ions are generally larger than B ions. In an embodiment, of the present disclosure A is Cs, B is Sn, and X is I.

As used herein, the term "thermoelectric material" generally refers to a material that can convert heat to electricity and vice-versa directly. The performance and efficiency of the thermoelectric materials is its ability to convert heat to electricity and vice-versa.

As used herein, the term "figure of merit" or (ZT) generally refers to a numerical expression taken as representing the performance or efficiency of a given device, material, or procedure. In the case of a thermoelectric material, this is determined by the material's electrical conductivity (σ), thermal conductivity (κ), and Seebeck coefficient (S), which change with temperature (T). The maximum efficiency of the energy conversion process (for both power generation and cooling) at a given temperature point in the material is calculated by $ZT=S^2T/\rho(\kappa_E+\kappa_l)$, where T is the absolute temperature, ρ is the electrical resistivity, S is the Seebeck-coefficient, $\kappa_l$ and $\kappa_E$ is the lattice and electronic thermal conductivities.

The present disclosure provides a method of making a $CsSnI_3$ perovskite thermoelectric material that can be employed for use in various applications, such as heating and/or cooling applications, or power generation. The thermoelectric materials of the current disclosure are pressure engineered to achieve a high figure of merit (ZT), and thereby high efficiency. Pressure engineering is an approach to modifying the material's interatomic bond length, density, forces, and other intrinsic properties, and the effects of hydrostatic pressure on the electronic and thermoelectric properties of the halide perovskite $CsSnI_3$ is provided.

Figure 2:
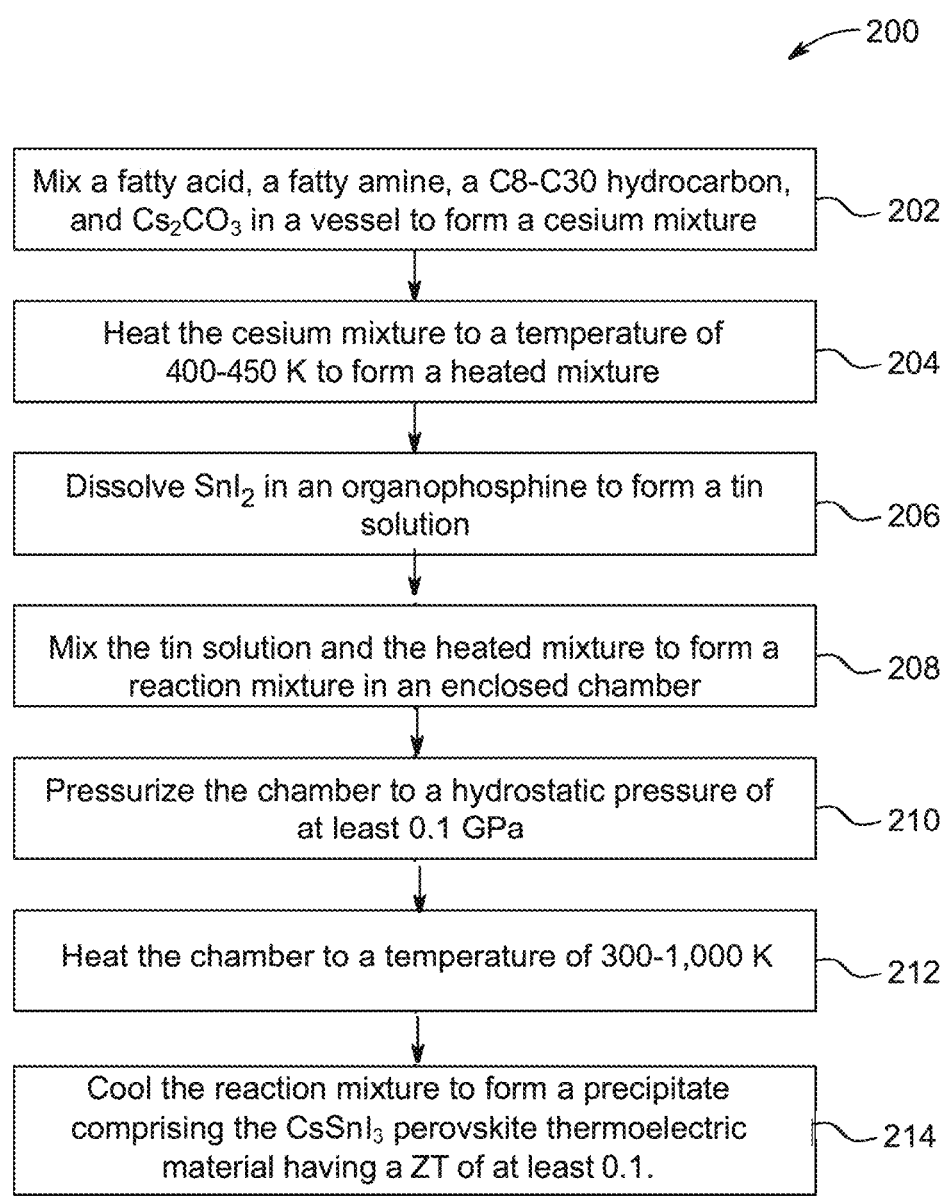
FIG. 2 is a flowchart depicting a method of making the $CsSnI_3$ perovskite thermoelectric material having a ZT that is at least 0.1, according to certain embodiments.

Referring to FIG. 2, a schematic flow diagram of a method 100 of making a $CsSnI_3$ perovskite thermoelectric material with a ZT of at least 0.1 is illustrated. The order in which the method 200 is described is not intended to be construed as a limitation, and any number of the described method steps may be combined in any order to implement the method 200. Additionally, individual steps may be removed or skipped from the method 200 without departing from the spirit and scope of the present disclosure.

At step 202, the method 200 includes mixing a fatty acid, a fatty amine, a $C_8$-$C_{30}$ hydrocarbon, and $Cs_2CO_3$ in a vessel to form a cesium mixture. In some embodiments, the fatty acid may be, but is not limited to, oleic acid, palmitic acid, stearic acid, linoleic acid, lauric acid, myristic acid, and/or arachidic acid. In some preferred embodiments, the fatty acid is oleic acid. In some embodiments, the fatty amine may be, but is not limited to, coco amine, oleyl amine, tallow amine, and soya amine. In some embodiments, the fatty amine is oleyl amine. In some embodiments, the $C_8$-$C_{30}$ hydrocarbon can include a straight chain or a branched hydrocarbon. In some embodiments, the $C_8$-$C_{30}$ hydrocarbon has an 8, 9, 10, 11, 12, 13, 14, 15, 16, 17, 18, 19, 20, 21, 22, 23, 24, 25, 26, 27, 28, 29, and/or 30 carbon chain. In some preferred embodiments, the $C_8$-$C_{30}$ hydrocarbon includes 1-octadecene. In some embodiments, the volume ratio of the fatty acid to the fatty amine is in a ratio of 1:5 to 5:1, preferably 1:3 to 3:1, and more preferably, 1:1. The cesium source may be any cesium salt, including but not limited to, cesium chloride, cesium carbonate, cesium iodide, and/or cesium nitrate. The cesium mixture may be mixed with a stir bar, or probe sonication, preferably at a temperature range of 320-380 K, preferably around 330-370 K, and more preferably at about 350 K to form the cesium mixture. In some embodiments, the mixing may be performed in an inert or a degassed atmosphere to form the cesium mixture.

At step 204, the method 200 includes heating the cesium mixture to a temperature of 350-500 K to form a heated mixture. In some embodiments, the cesium mixture is heated to a temperature range of 400-450 K, and more preferably about 425 K to form the heated mixture.

At step 206, the method 200 includes dissolving $SnI_2$ in an organophosphine to form a tin solution. In some embodiments, the organophosphine has a formula of $PR_nH_{3-n}$, where R is an organic substituent, and n is the number of organic substituents attached to the phosphine. In some embodiments, the organophosphine may be but is not limited to an alkylphosphine, phenylphosphine, dialkylphosphine, diphenylphosphine, trialkylphosphine, and/or triphenylphosphine, where the alkyl may be a straight chain or branched and is 1-30 carbons in length, preferably 5-25, 10-20, or approximately 15 carbons. In some embodiments, the organophosphine includes tri-n-octyl phosphine. The molar ratio of $SnI_2$ to the organophosphine may be in a range of 1:5 to 5:1, preferably 1:3 to 3:1, and more preferably 1:1. An equimolar ratio of $SnI_2$ may be dissolved in the organophosphine, particularly, tri-n-octyl phosphine, to form the tin solution. Step 206 may be performed simultaneously with step 202 and 204 in a separate vessel.

Although the description herein provided describes a method for preparing a $CsSnI_3$ perovskite TE material, aspects of the present disclosure may be directed towards the preparation of other cesium tin halide perovskite TE materials, albeit with a few variations, as may be obvious to a person skilled in the art. In an embodiment, at step 206 $SnBr_2$, or $SnCl_2$ may be added in place of $SnI_2$ to form $CsSnBr_3$, or $CsSnCl_3$, respectively.

At step 208, the method 200 includes mixing the tin solution and the heated mixture to form a reaction mixture in an enclosed chamber. The mixing of the tin solution with the heated mixture is to allow for initial growth of $CsSnI_3$ perovskite crystals. In an embodiment, the tin solution is injected rapidly into the heated mixture, where rapidly means all at once under conditions such that the tin solution and the heated mixture are held maintained at high pressure during the injecting. In an embodiment, the reaction mixture is at a temperature range of 400-500 K, and more preferably around 450 K for 0.1-5 minutes, preferably 0.5-4 minutes, 1-3 minutes or approximately 2 minutes. In an embodiment, the chamber is maintained in an inert atmosphere and the tin solution is added to the heated mixture at a temperature that is ±10 K of the temperature of the heated mixture. In an embodiment, the chamber is any vessel which can be sealed to be pressurized. In an embodiment, the chamber is an autoclave.

At step 210, the method 200 includes pressurizing the chamber to a hydrostatic pressure of at least 0.1 GPa. In some embodiments, the chamber has a hydrostatic pressure of 0.1-8 GPa. In the present disclosure, the chamber has a hydrostatic pressure of 0.1-2 GPa, and more preferably about 0.5, 1.0, 1.5, 2.0, 2.5, 3.0, 3.5, 4.0, 4.5, 5.0, 5.5, 6.0, 6.5, 7.0, 7.5, or 8.0 GPa.

At step 212, the method 200 includes heating the chamber to a temperature of 300-1,000 K. In some embodiments, the chamber is heated to 300-1,000 K, preferably 350-950 K, 400-900 K, 450-850 K, 500-800 K, 550-750 K, 600-700 K, or approximately 650 K. In an embodiment, steps 210 and 212 occur simultaneously. In an embodiment, after the perovskite crystals are initially formed in step 208 they further grown under high temperatures and high pressure, thereby pressure engineering the properties of the perovskite. In an embodiment, steps 210 and 212 occur for 1-500 minutes, preferably 50-450 mins, 100-400 mins, 150-350 mins, 200-300 mins, or approximately 250 mins.

At step 214, the method 200 includes cooling the reaction mixture to form a precipitate including the $CsSnI_3$ perovskite thermoelectric material having a ZT that is at least about 0.1. The cooling may be achieved by placing the reaction mixture in an ice-cold bath, where the temperature is maintained at about 0-5° C. The purpose of cooling the reaction mixture is to quench the growth of the nanocrystal.

In an embodiment, the $CsSnI_3$ perovskite crystals are not further purified. In an embodiment, the $CsSnI_3$ perovskite crystals may be purified. In an embodiment, the $CsSnI_3$ perovskite particles are purified by flocculation of the cooled reaction mixture to turbidity using an equal volume of 1-butanol followed by re-suspending in hexane. In an embodiment, the $CsSnI_3$ perovskite particles are centrifuged at 1,000-10,000 rotations per minute (rpm), preferably 2,000-9,000 rpm, 3,000-8,000 rpm, 4,000-7,000 rpm, or 5,000-6,000 rpm before filtering through a filter to remove aggregated material. In an embodiment, the filter is a 200±100 nm polytetrafluoroethylene (PTFE) filter.

In some embodiments, the $CsSnI_3$ perovskite has a cubic, tetragonal, or orthorhombic phase. In a preferred embodiment, the $CsSnI_3$ perovskite has a cubic phase. In an embodiment, the cubic structure has the Sn cation in 6-fold coordination, surrounded by an octahedron of anions, and the Cs cation in 12-fold cuboctahedral coordination.

In some embodiments, the $CsSnI_3$ perovskite thermoelectric material has a ZT of at least 0.01, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0. In some cases, the ZT is between 0.01 and 3, or 0.1 and 2.5, or 0.5 and 2.0.

In some embodiments, the $CsSnI_3$ perovskite thermoelectric material has a ZT of 1-1.5, preferably 1.1-1.4, or 1.2-1.3 when the chamber has a hydrostatic pressure of 0.1-2 GPa, preferably 0.5-1.5, or approximately 1.0 GPa, and a temperature of 500-600 K, preferably 520-580 K, 540-560 K, or approximately 550 K. In some embodiments, the $CsSnI_3$ perovskite thermoelectric material has a ZT of 0.1-0.9, 0.2-0.8, 0.3-0.7, 0.4-0.6, or approximately 0.5, when the chamber has a hydrostatic pressure of 0.1-2 GPa, preferably 0.5-1.5, or approximately 1.0 GPa, and a temperature of 300-400 K, preferably 320-380 K, 340-360 K, or approximately 350K. In some embodiments, the $CsSnI_3$ perovskite thermoelectric material has a ZT of 0.1-1, preferably 0.2-0.9, 0.3-0.8, 0.4-0.7, or 0.5-0.6 when the chamber has a hydrostatic pressure of 2.1-8 GPa, preferably 2.5-7.5, 3.0-7.0, 3.5-6.5, 4.0-6.0, 4.5-5.5, or approximately 5.0 GPa and a temperature of 300-600 K, preferably 350-550, 400-500, or approximately 450 K. In a preferred embodiment, the chamber has a hydrostatic pressure of about 1 GPa and a temperature of about 600 K.

In an embodiment, when the chamber has a hydrostatic pressure of about 1.5-1.9, preferably 1.6-1.8, or approximately 1.7 GPa the bandgap of the $CsSnI_3$ thermoelectric material is about 0 eV. As used herein the bandgap refers to the energy difference (in electron volts (eV)) between the top of the valence band and the bottom of the conduction band in insulators and semiconductors. In an embodiment, when the bandgap is about 0 eV the material has a more metallic behavior and improved conductivity, as less energy is required for an electron to move from the valence band to the conduction band than when the bandgap is wider. In an embodiment, when the chamber has a hydrostatic pressure of about 0-1.5 GPa, preferably 0.5-1.0, or approximately 0.7 GPa the bandgap of the $CsSnI_3$ perovskite thermoelectric material is about 0-0.2 eV, preferably 0.05-0.15, or approximately 0.1 eV. In an embodiment, when the chamber has a hydrostatic pressure of about 1.9-8 GPa, preferably 3-7 GPa, or approximately 4-6 GPa the bandgap of the $CsSnI_3$ perovskite thermoelectric material is about 0-0.3 eV, preferably 0.05-0.25, 0.1-0.2, or approximately 0.15 eV. In an embodiment, the bandgap of the $CsSnI_3$ perovskite thermoelectric material initially decreases as the vessel is pressurized up to about 1.7 GPa where band inversion occurs and the bandgap is about 0 GPa, further pressurizing up to 8 GPa further increases the bandgap. In a preferred embodiment, the vessel is pressurized at 1-2 GPa to be near the bandgap inversion range.

In an embodiment, higher ZT values are achieved by a simultaneous increase in the thermoelectric power factor and a decline in the total thermal conductivity. Further, for improved ZT values, materials should have a high electrical conductivity, a low thermal conductivity, and a high Seebeck coefficient. The thermoelectric properties such as electrical conductivity, absolute Seebeck coefficient, and the thermoelectric power factor in terms of the scattering time, as a function of the applied pressure, are depicted in FIGS. 5A-5D.

In an embodiment, as the hydrostatic pressure and temperature of the chamber increase the electrical conductivity of the $CsSnI_3$ perovskite thermoelectric material increases. Higher temperatures provides energy for electrons to move from the valence band to the conduction band, while the applied pressure narrows the energy gap up to a certain threshold to ease the task.

In an embodiment, as the hydrostatic pressure and temperature of the chamber increase the Seebeck coefficient of the $CsSnI_3$ perovskite thermoelectric material decreases. As used herein the Seebeck coefficient is a measure of the magnitude of an induced thermoelectric voltage in response to a temperature difference across that material.

As used herein, the thermal conductivity is the heat transfer ability through a sample that has a temperature difference between its two ends. In the formula for ZT, $ZT=S^2T/\rho(\kappa_E+\kappa_l)$, thermal conductivity ($\kappa$) has two components, lattice thermal conductivity ($\kappa_l$) and electronic thermal conductivity ($\kappa_E$). The lattice thermal conductivity is dominant over the electronic thermal conductivity. In an embodiment, as the temperature of the chamber increases the lattice thermal conductivity of the $CsSnI_3$ perovskite thermoelectric material decreases. In an embodiment, as the hydrostatic pressure and temperature of the chamber increase the electronic thermal conductivity of the $CsSnI_3$ perovskite thermoelectric material increases. In an embodiment, as the temperature of the chamber increases the overall thermal conductivity of the $CsSnI_3$ perovskite thermoelectric material decreases. In an embodiment, since the structural transitions of $CsSnI_3$ are a consequence of $SnI_6$ octahedra and rotations only, it would be thought to possess higher lattice thermal conductivity with a high-symmetry crystal structure. Therefore, increasing the temperature of the vessel with the $CsSnI_3$ perovskite thermoelectric material forms a material that has an unexpectedly low lattice thermal conductivity which in turn allows for increasing the ZT, e.g., by decreasing the lattice thermal conductivity at higher temperatures. This is beneficial because ZT is dependent on variables that are coupled with each other through the carrier concentration and effective mass, whereas lattice thermal conductivity is independent of these variables.

In an embodiment, as the hydrostatic pressure and temperature of the chamber increase the power factor (PF) of the $CsSnI_3$ perovskite thermoelectric material increases. As used herein, the power factor is defined as the numerator of the ZT equation. Therefore, larger power factors result in larger ZT values. This can be complemented by a low thermal conductivity as previously described.

As previously described, to achieve improved efficiency and ZT values of the $CsSnI_3$ perovskite thermoelectric material, a balance between the electrical conductivity, Seebeck coefficient, thermal conductivity, and power factor is preferred. This balance can be adjusted by pressure engineering and temperature variations; therefore the method of the current invention can be used to generate thermoelectric materials with high performance.

The CsSnI$_3$ perovskite thermoelectric material prepared by the method of the present disclosure may be used as a thermoelectric material in a thermoelectric generator, preferably the only thermoelectric material directly used in the TE generator to generate electricity. A thermoelectric generator is a solid state device that converts heat flux (temperature differences) directly into electrical energy. A thermoelectric system generates power by taking in heat from a source such as a hot exhaust flue. To operate, the system needs a large temperature gradient, therefore opposite the heat source, there is a cold side which may be cooled by air or water. In an embodiment, the TE material of the current disclosure is disposed between the hot and cold sides. The TE material absorbs the heat from the heat source on the hot side and then converts it to an electrical current which is collected directly from the TE material and can be used for other purposes. The electrical current is generated by the Seebeck effect, which is a phenomenon in which a temperature difference across a material produces a voltage difference. The heat is then dissipated on the cold side (opposite side) of the TE material. Thermoelectric generators can be used, for example, in power plants to convert waste heat into additional electrical power and in automobiles as automotive thermoelectric generators to increase fuel efficiency.

In an embodiment, CsSnI$_3$ perovskite thermoelectric material prepared by the method of the present disclosure may be fabricated in a thermoelectric integrated electronic chip. The current research direction in designing microelectronic devices is to minimize the size of the electronic chip while increasing its clock speed at higher frequencies, this results in high power dissipation density and as well increases the chip temperature. The high temperature in the chips can reduce their performance. As such, thermal management plays a role in designing computer chips. Thermoelectric materials can move the excess heat away from the chips through the Peltier effect. The Peltier effect is when an electric current is passed through a circuit of a thermocouple, heat is evolved at one junction and absorbed at the other junction. Therefore, one end of the thermoelectric material will cool the chip while another end acts as a heat sink. Thermoelectric devices can be fabricated in various sizes with different cooling capacities, which allows for chip hotspot locations while leaving the other non-hotspot locations uncooled.

In an embodiment, CsSnI$_3$ perovskite thermoelectric material prepared by the method of the present disclosure may be fabricated in a modular cooler. The CsSnI$_3$ perovskite thermoelectric material plays a similar role in the modular cooler to that in the thermoelectric integrated electronic chip.

EXAMPLES

The following examples demonstrate exemplary embodiments of the properties of cesium tin halide perovskite, as described herein. The examples are provided solely for illustration and are not to be construed as limitations of the present disclosure, as many variations thereof are possible without departing from the spirit and scope of the present disclosure.

Example 1: CsSnI$_3$ Perovskite Synthesis

The reaction vessel is a stainless steel autoclave. 0.8 milliliters (ml) of oleic acid, 0.8 ml of oleyl amine, and 24 ml of 1-octadecene are loaded into the reaction vessel and degassed for one hour under vacuum ($10^{-2}$ millibar or better) at 350 K. 0.26 gram (g) Cs$_2$CO$_3$ is added to the reaction vessel and degassed for one hour at the same pressure and temperature. The reaction vessel is flushed with nitrogen and heated to 375 K for one hour or until all Cs$_2$CO$_3$ dissolves. Subsequently, the reaction mixture is heated to the chosen reaction temperature (typically 450 K) before 5 ml of a 1 molar (M) solution of SnI$_2$ and tri-n-octyl phosphine is swiftly injected into the prepared Cs-precursor. An equimolar ratio of SnI$_2$ dissolved in tri-n-octyl phosphine is used to prepare the mixed tin samples. The reaction vessel is then pressurized to at least 0.1 GPa and no higher than 8 GPa for the duration of the reaction. Concurrently, the reaction vessel is maintained at a temperature of 300-1,000 K. The reaction vessel is kept at the pressure and temperature for 1 minute before an ice-cold water bath is placed under the autoclave to quench further crystal growth. Purification of the as-synthesized crystals is performed in an Argon-filled glovebox (O$_2$, H$_2$O<1 parts per million (ppm)). Perovskite particles are purified by flocculation to turbidity using an equal volume of 1-butanol followed by re-suspending in hexane. This process is repeated twice. The final crystal solution is centrifuged at 4000 rotations per minute (rpm) for 2 minutes before filtering through a 200 nm polytetrafluoroethylene (PTFE) filter to remove aggregated material. This method is adapted from T. C. Jellicoe, J. M. Richter, H. F. J. Glass, M. Tabachnyk, R. Brady, S. E. Dutton, A. Rao, R. H. Friend, D. Credgington, N. C. Greenham, M. L. Böhm, Synthesis and Optical Properties of Lead-Free Cesium Tin Halide Perovskite Nanocrystals, J. Am. Chem. Soc. 2016 138 (9), 2941-2944, hereby incorporated by reference in its entirety.

Example 2: Computational Details for ZT Determination

First principal calculations within the density functional theory (DFT) framework were implemented in the quantum espresso simulation package to study the electronic, pressure-dependent thermoelectric behavior and vibrational properties of CsSnI$_3$ material [P. Giannozzi, S. Baroni, N. Bonini, M. Calandra, R. Car, C. Cavazzoni, D. Ceresoli, G. L. Chiarotti, M. Cococcioni, I. Dabo, A. Dal Corso, S. de Gironcoli, S. Fabris, G. Fratesi, R. Gebauer, U. Gerstmann, C. Gougoussis, A. Kokalj, M. Lazzeri, L. Martin-Samos, N. Marzari, F. Mauri, R. Mazzarello, S. Paolini, A. Pasquarello, L. Paulatto, C. Sbraccia, S. Scandolo, G. Sclauzero, A. P. Seitsonen, A. Smogunov, P. Umari, R. M. Wentzcovitch, QUANTUM ESPRESSO: a modular and open-source software project for quantum simulations of materials, J. Phys. Condens. Matter. 21 (39) (2009) 395502, hereby incorporated by reference in its entirety]. The projector augmented wave (PAW) pseudopotentials under the generalized gradient approximation (GGA) within the modified Perdew-Burke-Ernzerhof (PBESol) exchange-correlation functional was used [J. P. Perdew, K. Burke, M. Emzerhof, Generalized gradient approximation made simple, Phys. Rev. Lett. 77 (1996) 3865-3868, hereby incorporated by reference in its entirety]. The lattice parameters were calculated after geometrical relaxations in which convergence is attained when the difference of the Hellmann-Feynman forces between successive iterations is less than $10^{-4}$ eV/A$^\circ$ for the atoms. A dense $\Gamma$-centered 22×22×22 k-mesh, spanning the first Brillion zone for the primitive unit cell was utilized as the Monkhorst-Pack grid scheme to evaluate the electronic density of states using the linear tetrahedron method. The Kohn-Sham orbitals were expanded on a plane wave basis with energy cut-off set to 48 Ry for all the self-consistent field calculations in which relaxations were deemed reached when the ground state energy difference between successive iterations falls below $10^{-6}$ eV. Spin-orbit coupling was used to investigate its influence on the electronic and phonons characteristics of the material.

The thermoelectric properties were calculated by solving the Boltzmann transport equations implemented in the boltztrap2 code from the band structure data used for DOS calculations [G. K. H. Madsen, D. J. Singh, BoltzTraP. A code for calculating band-structure dependent quantities, Comput. Phys. Commun. 175 (2006) 67-71, hereby incorporated by reference in its entirety]. The thermoelectric figure of merit for different pressures was calculated after evaluating the carrier relaxation time using lattice deformation potential theory. The lattice thermal conductivity of the material was calculated using Phono3py within the finite displacement approach through the linearized phonon Boltzmann equation in which 2×2×2 supercells were built for the evaluation of the third-order force constants, and the reciprocal spaces were samples using 11×11×111 meshes [A. Togo, I. Tanaka, First principles phonon calculations in materials science, Scr. Mater. 108 (2015) 1-5, hereby incorporated by reference in its entirety].

Example 3: Electronic Structure

Figure 3:
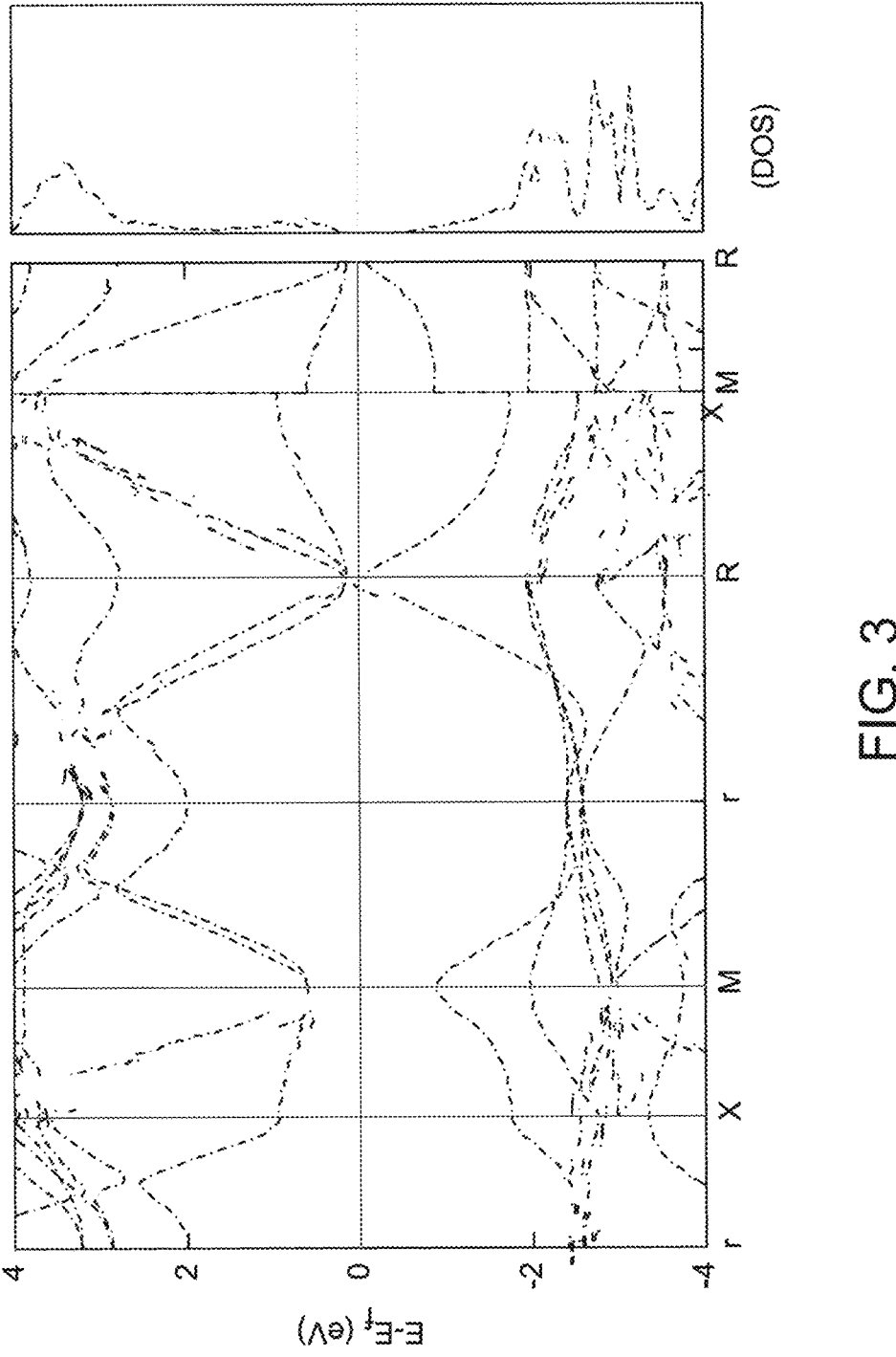
FIG. 3 shows an electronic band structure and density of states (DOS) of $CsSnI_3$ with spin-orbit coupling (SOC) at 0 Gigapascals (GPa) pressure, according to certain embodiments.

The thermal and electronic properties of materials influence their thermoelectric power conversion efficiency. $CsSnI_3$ belongs to the cubic perovskite family consisting of a corner-sharing $SnI_6$ octahedral network. The material undergoes a series of structural phase transitions as the temperature dwindles from high to low due to rearrangements and rotations of the $SnI_6$ octahedral [S.-D. Guo, J.-L. Wang, Potential thermoelectric materials $CsMI_3$ (M=Sn and Pb) in perovskite structures from first-principles calculations, RSC Adv. 6 (2016) 101552-101559]. The transition starts from the cubic to the tetragonal phase and then to the orthorhombic phase as the temperature decreases. The material possesses three polymorphs having a direct energy gap (α-, β-, and Y-$CsSnI_3$) and one indirect (γ-$CsSnI_3$). The direct gap category favors photovoltaic applications because of the effective electron-hole transport mechanism. Cubic $CsSnI_3$ with space group pm3m was investigated, the phase that is stable near room temperature. The electronic structures were computed using PBESol functional with SOC as presented in FIG. 3 for the 0 GPa pressure. It was revealed that $CsSnI_3$ has a direct bandgap with the VBM and conduction band minimum (CBM) at the point R $(1,1,1)\pi/a$.

Figure 4A:
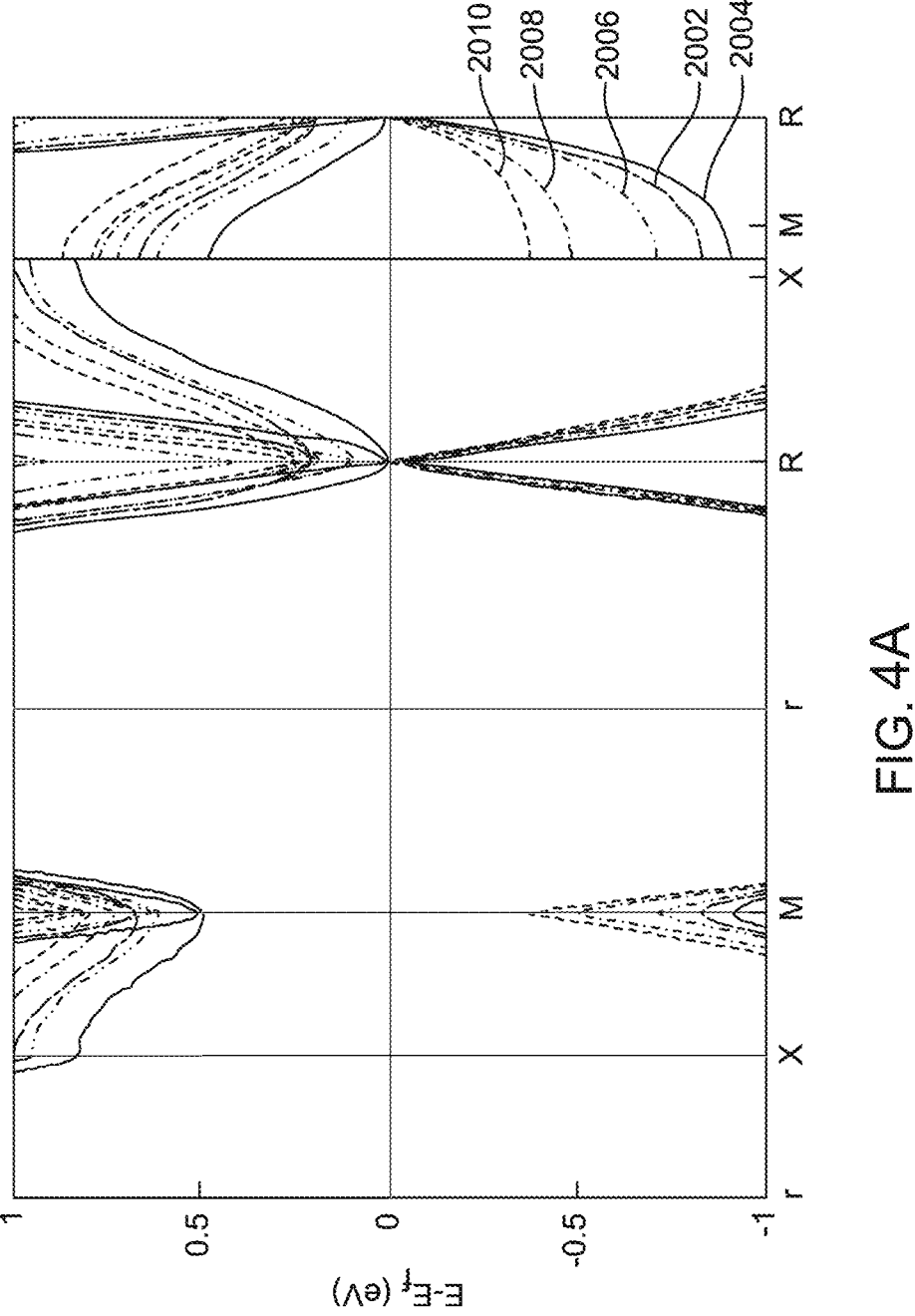
FIG. 4A is a plot showing an electronic band structure around the Fermi level of $CsSnI_3$, according to certain embodiments.

The main reason for the occurrence of the CBM and the VBM at symmetry direction R was that at such point in k-space, the p-orbitals (anions) with their same-sign lobes direct toward the center of the octahedron that surrounds the Sn atom; hence yielding strong interaction. The non-monotonic change of the energy gap with pressure was especially noticed, unlike many semiconducting materials. The study (FIG. 4A) was performed at different pressures, namely, 0 GPa (2002), 1.7 GPa (2004), 4 GPa (2006), 6 GPa (2008), and 8 GPa (2010). The bandgap initially reduced upon compression, inducing more metallicity, gradually increasing with applied hydrostatic pressure. Pressure-driven band inversion was observed at 1.7 GPa. The VBM and CBM were found to overlap at the high symmetry point R in the Brillion zone at 1.7 GPa and then re-opened afterward with an inversion between the valence band and conduction band.

Figure 4B:
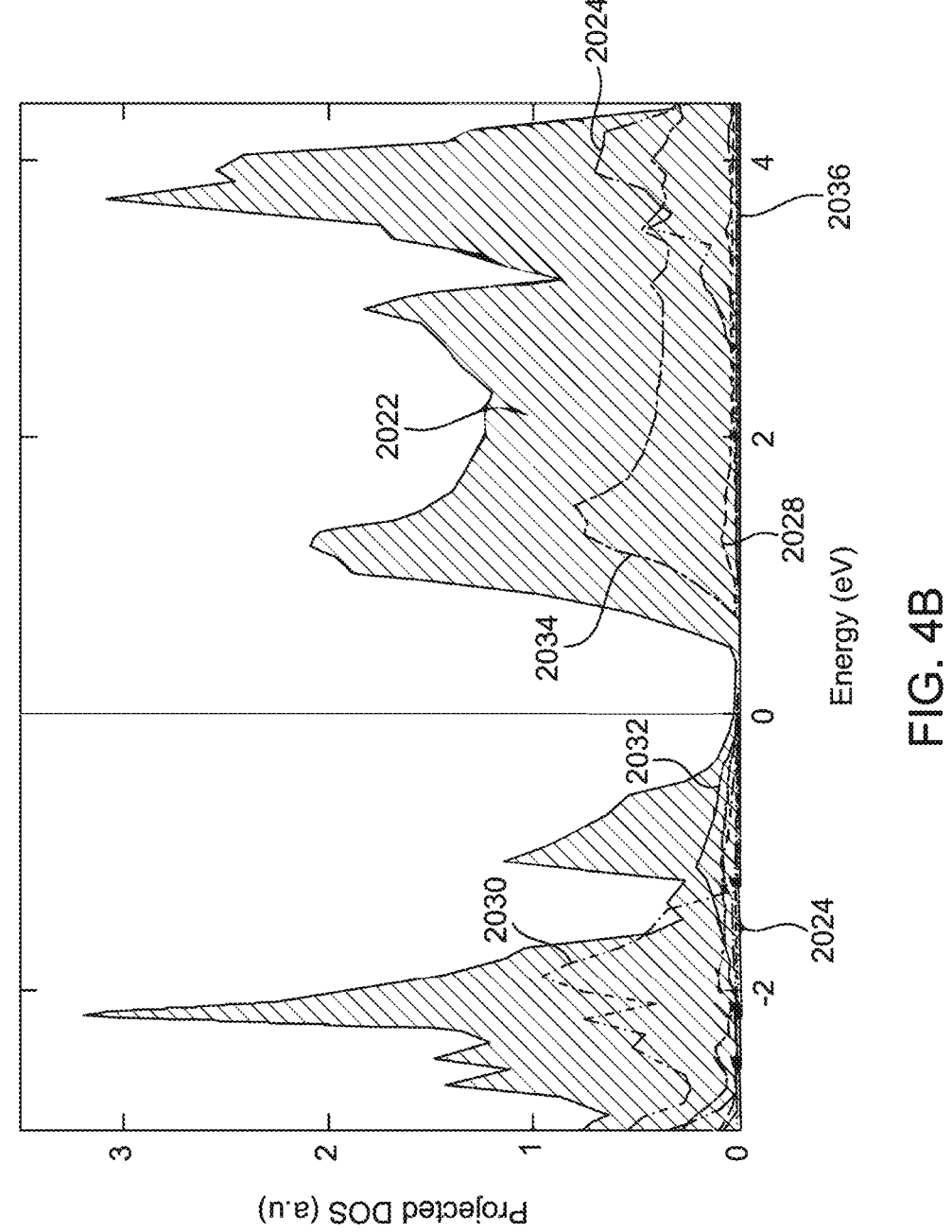
FIG. 4B is a plot showing the projected DOS of $CsSnI_3$, according to certain embodiments.
Figure 4C:
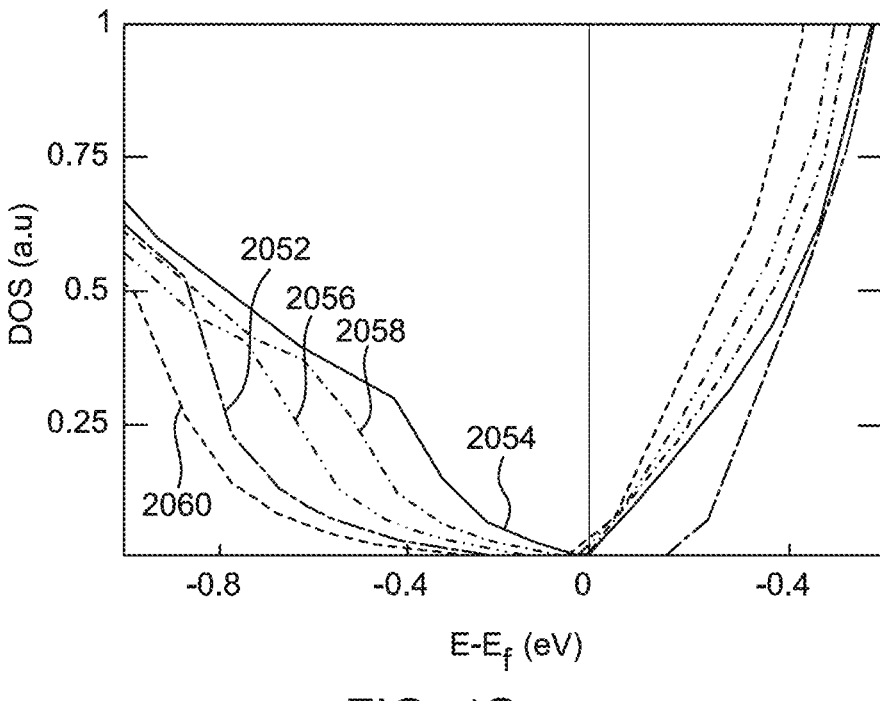
FIG. 4C is a plot showing an electronic DOS around the Fermi level, according to certain embodiments.
Figure 4D:
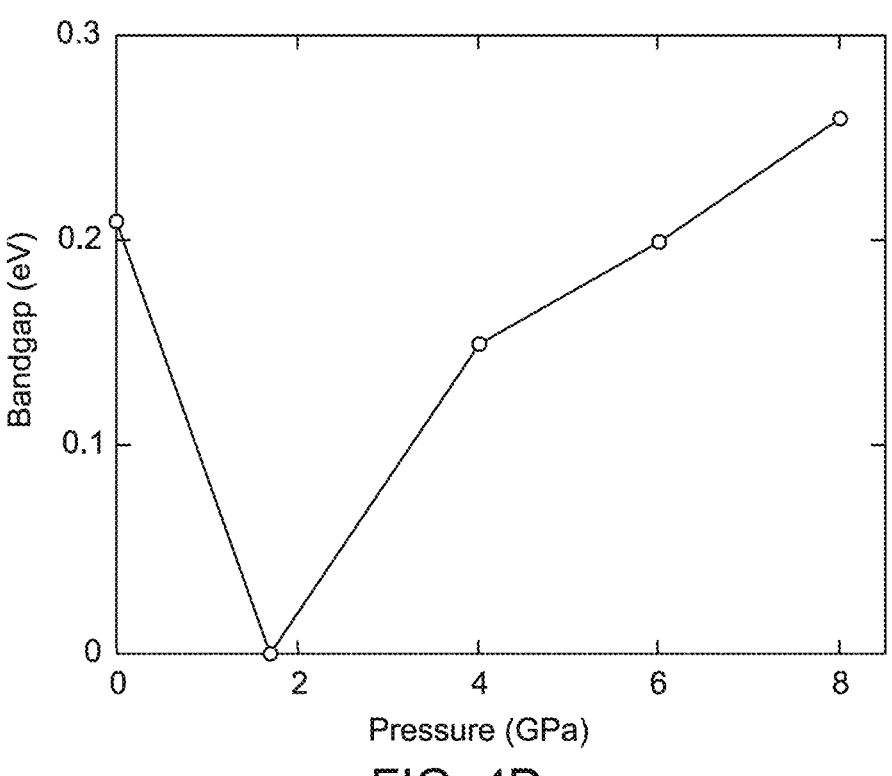
FIG. 4D is a plot showing a variation of bandgap with applied pressure, according to certain embodiments.

The calculated zero temperature energy bandgap for the materials with the SOC was 0.21 eV at 0 GPa pressure. The evolution of the energy band structure and the DOS for different applied pressures (0 GPa-8 GPa) around the Fermi level was calculated. The projected DOS for the materials (2022) is depicted in FIG. 4B. The data indicates that the Sn-p (2034) and Cs-s (2024) states dominate the conduction band while the contribution of electrons in the valence band is majorly from Sn-p (2034), Sn-s (2032), and I-p (2030) states with a very few from the Cs-p (2026) orbital, and barely from I-s (2028), and Sn-d (2036) states. If the crystal was assumed to be at zero temperature, i.e., all the electronic states below the Fermi level were filled while those above were empty; it can be inferred that electrons from Cs atoms rarely participate in the valence bonding compared to the electrons in Sn and I atoms. Thus, the electrons from Cs atoms were often considered to be used for balancing the overall distribution of the charge within the crystal. FIG. 4C depicts the change in the DOS near the Fermi level for different applied pressures, namely, 0 GPa (2052), 1.7 GPa (2054), 4 GPa (2056), 6 GPa (2058), and 8 GPa (2060) while FIG. 4D describes the variation of the material's bandgap with applied pressure. The so-called band inversion point could be noticed near 1.7 GPa applied pressure.

Figure 4E:
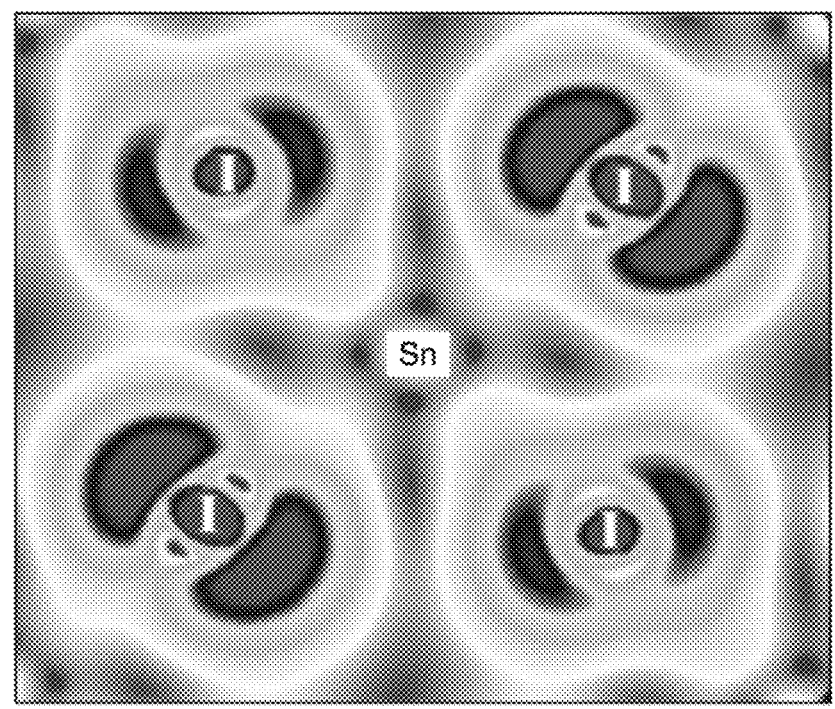
FIG. 4E is a plot showing a partial charge density at the valance band maximum (VBM), indicating Sn-s and I-p antibonding, according to certain embodiments.

While the VBM was non-degenerate, the CBM is 3-fold degenerate and splits into a doublet and a quadruplet after including SOC. This is usually uncommon among tetrahedrally bonded semiconductors. Similar behavior was observed in the work of Ling et al., [L. Y. Huang, W. R. L. Lambrecht, Electronic band structure, phonons, and exciton binding energies of halide perovskites $CsSnCl_3$, $CsSnBr_3$, and $CsSnI_3$, Phys. Rev. B—Condens. Matter Mater. Phys. 88 (2013), 165203] where it was tagged as a so-called "inverted" band structure. It can be perceived from FIG. 4B that the CBM was dominated by Sn-p states and the VBM was composed of Sn-s (2032), and I-p (2030) states. As a result, an antibonding combination was formed between Sn-s (2032), and I-p (2030) orbitals, as presented by the charge distribution in FIG. 4E. A stronger Sn-s to anion p orbitals towards the edge of the VBM at this particular k-point R was observed. This was because the p-orbitals on either side of the primitive cell vary by a phase $e^{iK.T}=-1$ at the k-point R; hence, they point inward toward the Sn-s-orbital as demonstrated in ref. [L. Y. Huang, W. R. L. Lambrecht, Electronic band structure, phonons, and exciton binding energies of halide perovskites $CsSnCl_3$, $CsSnBr_3$, and $CsSnI_3$, Phys. Rev. B-Condens. Matter Mater. Phys. 88 (2013), 165203]. This implies their strong interaction with each other and thus belong to the same $a_{1g}$ irreducible representation of the group. Hence, the gap may be considered intra-atomic between Sn-p and Sn-s.

Following the notations of Bose et al. [S. K. Bose, S. Satpathy, O. Jepsen, Semiconducting $CsSnBr_3$, Phys. Rev. B. 47 (1993) 4276-4280], further group theory analysis revealed that the CBM possessed R15 symmetry. However, none of the I-5p orbital combinations emanating from any face of the unit-cell was a member of this irreducible representation of the cubic group. The interaction with Cs-5p below was also minimal. Although there exists some interaction with the I-5s state which also forms the R15 linear combinations at R-point but appears very deep inside such that the topmost state would have only a few I-5s contributions. The small interaction with Cs-5d states higher-up, which also belongs to the same irreducible representation, tends to decrease the energy gap. Meanwhile, the Sn-s and I-5p interaction, which gave rise to the R1 two-states symmetry, is manifestly strong due to the closeness of the two levels and hence the existence of the strong hybridization.

Example 4: Thermoelectric Properties

The study of the thermoelectric transport properties was based on the calculations of the electronic band structures and the related DOS followed by the Boltzmann transport theory. Consequently, the thermoelectric coefficients were computed accordingly. The semi-classical transport variables such as electrical conductivity, absolute Seebeck coefficient, and the thermoelectric power factor in terms of the scattering time, as a function of the applied pressure, are depicted in FIGS. 5A-5D. The study was performed at a temperature range of 300K to 600K, particularly at 300 K (2102), 400 K (2104), 500 K (2106), and 600 K (2108). The large Seebeck coefficient induced by the high slope of the DOS around the energy gap was observed [Ajay Soni, Zhao Yanyuan, Yu Ligen, Michael Khor Khiam Aik, Mildred S. Dresselhaus, Qihua Xiong, Enhanced thermoelectric properties of solution grown Bi 2 Te 3-x Se x nanoplatelet composites, Nano Lett. 12 (2012) 1203-1209]. Another factor that enhanced the slope of the DOS is band degeneracy. While the electrical conductivity improved with the increase in pressure, the Seebeck coefficient declined with applied pressure resulting in a non-monotonic change in the power factor. The electrical conductivity of the material increased monotonically with both temperatures and pressures as presented in FIG. 5A thereby reflecting its semiconducting behavior [Ananya Banik, U. Sandhya Shenoy, Sujoy Saha, Umesh V. Waghmare, Kanishka Biswas, High power factor and enhanced thermoelectric performance of SnTe—AgInTe2: synergistic effect of resonance level and valence band convergence, J. Am. Chem. Soc. 138 (2016) 13068-13075]. The increase in temperature supplied adequate thermal energy to accelerate the majority of carriers for enhanced electrical conduction while the applied pressure narrowed the energy gap up to a certain threshold to ease the task. The electrical conductivity was related to the carrier concentration via $\sigma=\eta e\mu$, where '$\mu$' and 'e' are the mobility and electronic charge, respectively. The positive temperature dependence of the electrical conductivity results from the coupling existing between n and T.

Figure 5A:
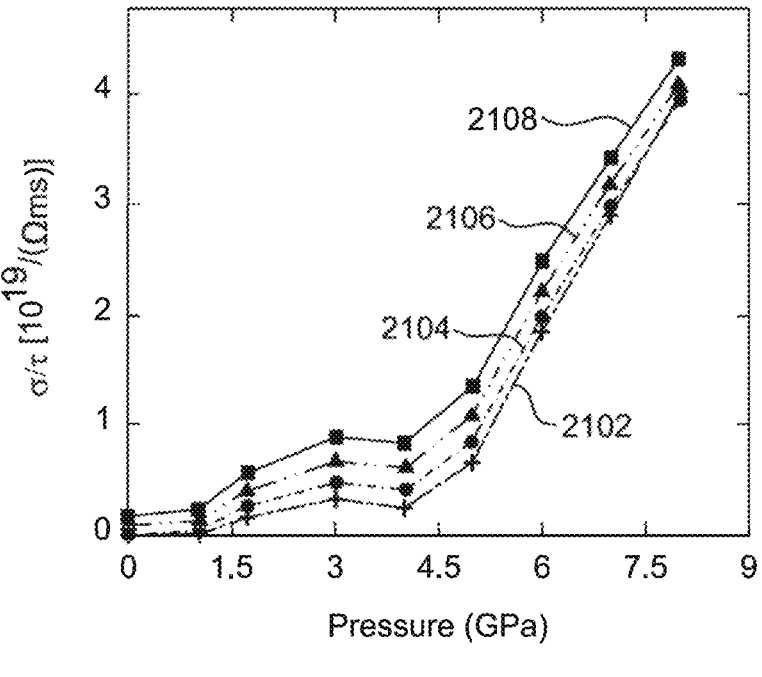
FIG. 5A is a plot depicting the electrical conductivity of $CsSnI_3$ at different pressures, according to certain embodiments.
Figure 5B:
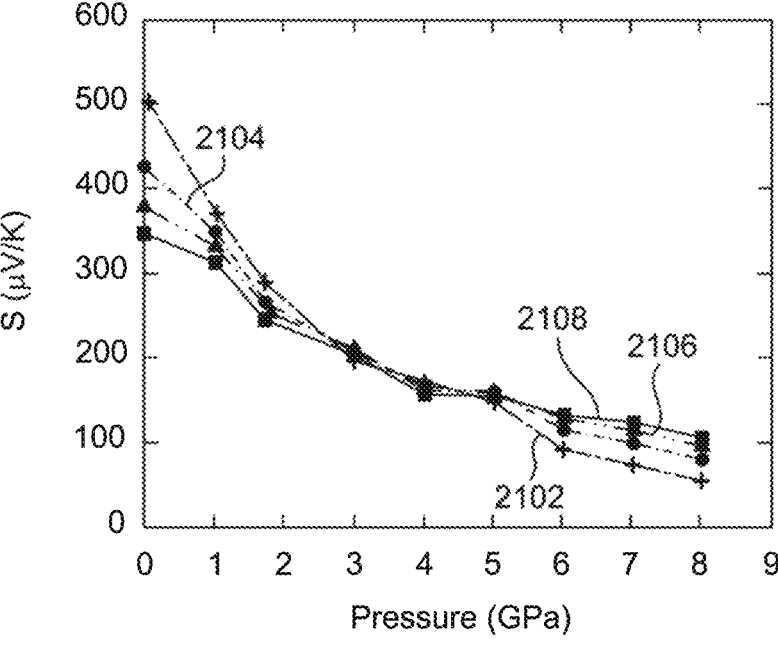
FIG. 5B is a plot depicting the Seebeck coefficient of $CsSnI_3$ at different pressures, according to certain embodiments.
Figure 5C:
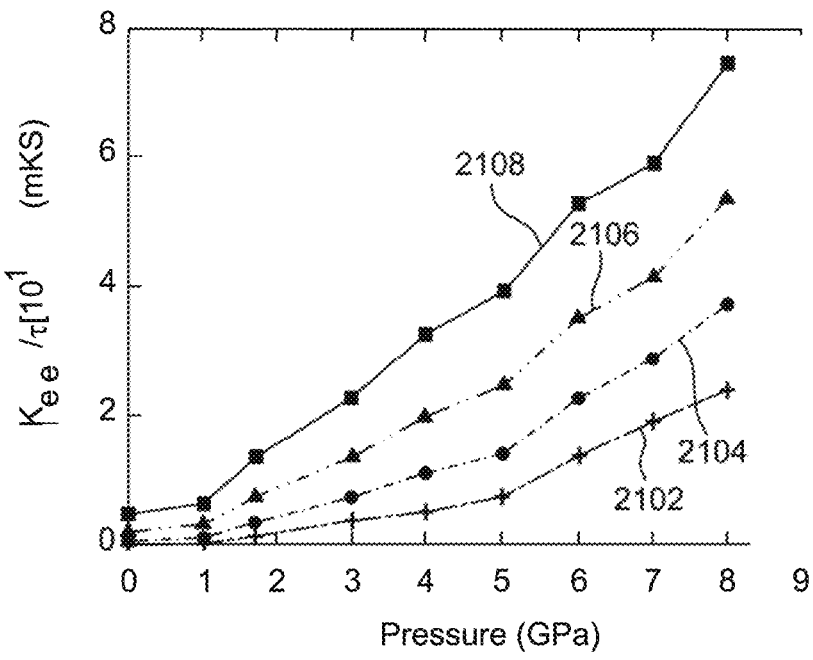
FIG. 5C is a plot depicting the electronic thermal conductivity of $CsSnI_3$ at different pressures, according to certain embodiments.
Figure 5D:
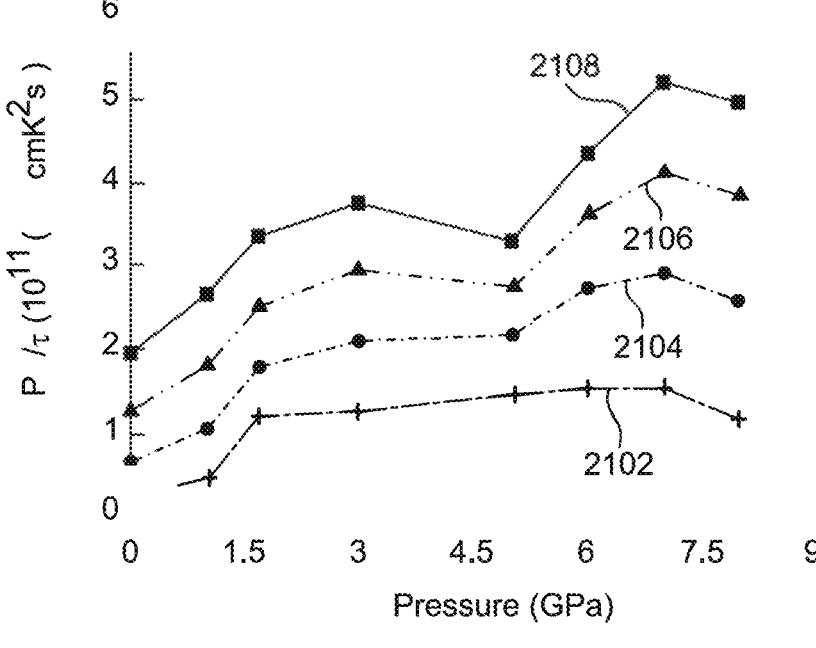
FIG. 5D is a plot depicting the power factor of $CsSnI_3$ at different pressures, according to certain embodiments.
Figures 6, 7:
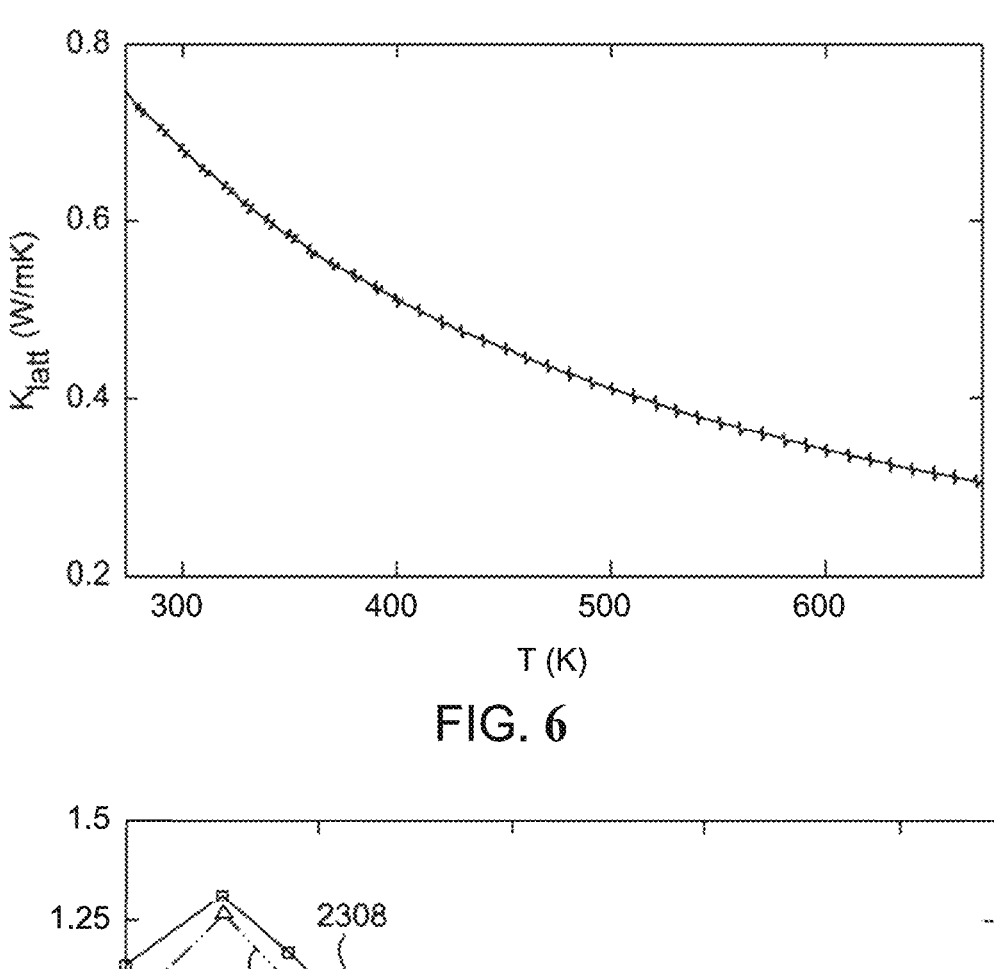
FIG. 6 is a plot showing calculated lattice thermal conductivity of $CsSnI_3$, according to certain embodiments.
FIG. 7 is a plot depicting pressure-dependent ZT of $CsSnI_3$ and relaxation times calculated at different temperatures, according to certain embodiments.

The Seebeck coefficient decreases with applied hydrostatic pressure (FIG. 5B) in agreement with previous reports [Andrew Gaul, Qing Peng, David J. Singh, Ganpati Ramanath, Theodorian Borca-Tasciuc, Pressure-induced insulator-to-metal transitions for enhancing thermoelectric power factor in bismuth telluride-based alloys, Phys. Chem. Chem. Phys. 19 (2017) 12784-12793]. Below 4 GPa, the Seebeck coefficients gradually reduced with increasing temperature due to a rise in holes and electrons conductivity which improves the carrier concentration (n). The relation between the Seebeck coefficient and the carrier concentration can be described as [Y. S. Wudil, M. A. Gondal, S. G. Rao, S. Kunwar, A. Q. Alsayoud, Substrate temperature-dependent thermoelectric figure of merit of nanocrystalline $Bi_2Te_3$ and $Bi_2Te_2.7Se_{0.3}$ prepared using pulsed laser deposition supported by DFT study, Ceram. Int. 46 (2020) 24162-24172]

$$\frac{S}{T} = -\frac{\pi^2 k_B^2}{3|e|} \frac{\partial \ln \sigma(E)}{(\partial E)x}\bigg|_{E_F} = -\frac{\pi^2 k_B^2 m^*}{\left((3\pi^2)^{\frac{2}{3}}|e|\hbar^2 n^{\frac{2}{3}}\right)} \qquad \text{Eq. (1)}$$

Where m* is the effective mass of electrons, 'T' is temperature, '$K_B$' is the Boltzmann constant, 'n' is carrier density, 'e' is the electronic charge, '$E_F$' is the Fermi energy, 'h' is Planck constant, and '$\sigma(E)$' is conductivity. This equation explains the inverse relationship between carrier concentration and 'S'. However, above 4 GPa, the apparent increase in thermal energy caused the Seebeck coefficient to increase with the temperature since there was a flow of thermally excited minority carriers. Furthermore, such a transition at a given pressure could be due to the change in the material's bandgap with pressure. The bandgap initially decreased with pressure unveiling metallic characteristic causing an increase in effective mass which thus affects the TE properties. However, the energy gap subsequently increased linearly with applied pressure typical of semiconducting materials. The lattice contribution to the total thermal conductivity is a fundamental factor in evaluating the ZT, and it substantially affects the overall TE performance. The electronic contribution to the total thermal conductivity is depicted in FIG. 5C. Noteworthy, while the $k_l$ decreased with temperature (FIG. 6), $k_e$ improved with increasing temperature. Since the $k_l$ is the dominant part at lower temperatures, the total thermal conductivity was said to decrease with increasing temperature. Since the structural transitions of $CsSnI_3$ is a consequence of $SnI_6$ octahedra and rotations only [S.-D. Guo, J.-L. Wang, Potential thermoelectric materials $CsMI_3$ (M=Sn and Pb) in perovskite structures from first-principles calculations, RSC Adv. 6 (2016) 101552-101559], it would be thought to possess higher lattice thermal conductivity with a high-symmetry crystal structure. The power factor is a key parameter representing the trade-off between the relevant parameters. FIG. 5D shows the change in the PF with applied pressures for the different temperatures. As the pressure increases, the PF also increased up to 5 GPa further which it declined. This can be described as a consequence of the decrease in the effective mass of electron caused by the reduced bandgap as the pressure increases, since the Seebeck coefficient depends directly on m*. Although the electrical conductivity was enhanced by the reduction in m*, the overall power factor depended on the Seebeck coefficient. The thermoelectric ZT was calculated for different pressures (FIG. 7) after evaluating the carrier relaxation time t, using the lattice deformation potential theory as presented in Xiaorui Chen, Yuhong Huang, Hong Chen, Thermoelectric properties of D03 V3Al using first principles calculations, RSC Adv. 7 (2017) 44647-44654. Briefly, the relaxation time for a three-dimensional system is expressed as follows:

$$\tau = \left(2\sqrt{2} Ch\right) \bigg/ \left(3(2\pi)^4 (K_B Tm)^{\frac{3}{2}} E^2\right) \qquad \text{Eq. (2)}$$

where 'h' is Planck's constant, 'm' represents the effective mass and 'C' represents the elastic constant given as:

$$C = \frac{1}{Vo} \frac{\partial^2 E}{\partial \left(\frac{\Delta l}{lo}\right)^2} \qquad \text{Eq. (3)}$$

Where '$V_o$' and '$l_o$' are the equilibrium volume and lattice parameter, $\Delta l = l - lo$ is the lattice distortion and 'E' is the corresponding free energy of the system. The deformation potential constant 'E' denotes the shift of the conduction (valence) band edge with respect to unit strain, which can be expressed as:

$$E = \frac{\partial E_{edge}}{\partial \left(\frac{\Delta l}{lo}\right)} \qquad \text{Eq. (4)}$$

The results showed that ZT value peaked around 1-1.7 GPa applied pressures for all the temperature range. The increase in ZT values with temperature becomes more significant.

The effect of applied hydrostatic pressure on the electronic and thermoelectric transport properties of n-type cubic $CsSnI_3$ perovskite using DFT with spin-orbital coupling was investigated. In the electronic band structure, the strong Sn-s antibonding state of the VBM led to a triply degenerate p-like conduction band and a non-degenerate s-like valence band. A non-monotonic change in the energy bandgap of the material was witnessed, decreasing initially exhibiting metallic characteristics and then increasing above 1.7 GPa applied pressure. Pressure-driven band inversion was observed at 1.7 GPa in which the VBM and CBM were found to overlap at the high-symmetry point R in the Brillion zone. The value of the direct bandgap was underestimated as it is the practice with the DFT-calculated energy gaps using the local density approximations. The obvious Sn-s and I-p antibonding in the valence band maximum was observed in partial charge density calculations. Phonon dispersion studies revealed that the cubic phase was more stable at higher temperatures due to the existence of some soft modes along with the high-symmetry directions. A monotonic decrease in the Seebeck coefficient at all pressures for different temperatures, 300K (2302), 400 K (2304), 500 K (2306), and 600 K (2308) was observed, whereas the electrical conductivity has improved with applied pressure at all temperatures in agreement with the previous reports. A peak ZT of 1.26 was achieved at 1 GPa applied pressure at 600 K. While pressure can be used to engineer the material's transport properties, other defect incorporation can also be employed to manipulate the lattice thermal conductivity in tandem thereby boosting the overall efficiency of n-type cubic $CsSnI_3$ perovskite.

Numerous modifications and variations of the present invention are possible in light of the above teachings. It is therefore to be understood that within the scope of the appended claims, the invention may be practiced otherwise than as specifically described herein.

The invention claimed is:

1. A method of making a $CsSnI_3$ perovskite thermoelectric material having a figure of merit (FoM ZT) from 1 to 1.5, comprising:

mixing a fatty acid, a fatty amine, a C8-C30 hydrocarbon, and $Cs_2CO_3$ in a vessel to form a cesium mixture;

heating the cesium mixture to a temperature of 400-450 K to form a heated mixture;

dissolving $SnI_2$ in an organophosphine to form a tin solution;

mixing the tin solution and the heated mixture to form a reaction mixture in an enclosed chamber;

pressurizing the chamber containing the reaction mixture to a hydrostatic pressure of 1.7 GPa;

heating the chamber and the reaction mixture to a temperature of 500 to 600 K;

then cooling the reaction mixture to form a precipitate comprising the $CsSnI_3$ perovskite thermoelectric material having a FoM ZT from 1 to 1.5, wherein the bandgap of the $CsSnI_3$ perovskite thermoelectric material is 0 eV, wherein the bandgap of the $CsSnI_3$ perovskite thermoelectric material is inverted at a pressure of 1.7 GPa, and wherein FoM ZT represents an efficiency of the $CsSnI_3$ perovskite thermoelectric material's energy conversion process.

2. The method of claim 1, wherein the $CsSnI_3$ perovskite has a cubic, tetragonal, or orthorhombic phase.

3. The method of claim 1, wherein the $CsSnI_3$ perovskite has a cubic phase.

4. The method of claim 1, wherein an electrical conductivity of the $CsSnI_3$ perovskite thermoelectric material increases as the hydrostatic pressure of the chamber increases.

5. The method of claim 1, wherein a Seebeck coefficient of the $CsSnI_3$ perovskite thermoelectric material decreases as the hydrostatic pressure of the chamber increases.

6. The method of claim 1, wherein the chamber and the reaction mixture are heated to a temperature of 540-560 K.

7. The method of claim 1, wherein the chamber and the reaction mixture are heated to a temperature of 500-550 K.

8. The method of claim 1, wherein the chamber and the reaction mixture are heated to a temperature of 550-600 K.

9. The method of claim 1, wherein the $CsSnI_3$ perovskite thermoelectric material has a FoM ZT from 1.1 to 1.4.

10. The method of claim 9, wherein the $CsSnI_3$ perovskite thermoelectric material has a FoM ZT from 1.2 to 1.3.

* * * * *